United States Patent
Sollenberger et al.

(10) Patent No.: US 7,809,043 B2
(45) Date of Patent: *Oct. 5, 2010

(54) METHOD AND SYSTEM FOR A FLEXIBLE AUTOMATIC FREQUENCY CONTROL (AFC) DESIGN SUPPORTING TRANSMIT DIVERSITY

(75) Inventors: Nelson Sollenberger, Farmingdale, NJ (US); Zoran Kostic, Holmdel, NJ (US); Joseph Boccuzzi, Manalapan, NJ (US)

(73) Assignee: Broadcom Corporation, Irvine, CA (US)

( * ) Notice: Subject to any disclaimer, the term of this patent is extended or adjusted under 35 U.S.C. 154(b) by 785 days.

This patent is subject to a terminal disclaimer.

(21) Appl. No.: 11/565,579

(22) Filed: Nov. 30, 2006

(65) Prior Publication Data

US 2008/0132177 A1    Jun. 5, 2008

(51) Int. Cl.
     *H04B 1/00*     (2006.01)
(52) U.S. Cl. ........................ 375/139; 375/347
(58) Field of Classification Search ........... 375/136, 375/139, 140, 144, 147, 344–345, 347
See application file for complete search history.

(56) References Cited

U.S. PATENT DOCUMENTS

| | | | |
|---|---|---|---|
| 5,321,850 A * | 6/1994 | Backstrom et al. | 455/139 |
| 6,289,061 B1 * | 9/2001 | Kandala et al. | 375/344 |
| 6,333,947 B1 * | 12/2001 | van Heeswyk et al. | 375/148 |
| 6,608,858 B1 * | 8/2003 | Sih et al. | 375/147 |
| 7,020,492 B2 * | 3/2006 | Doi et al. | 455/562.1 |
| 7,443,826 B1 * | 10/2008 | Atarius et al. | 370/342 |
| 2008/0013650 A1 * | 1/2008 | Engdahl | 375/344 |

\* cited by examiner

*Primary Examiner*—Emmanuel Bayard
(74) *Attorney, Agent, or Firm*—McAndrews, Held & Malloy

(57) ABSTRACT

Aspects of a method and system for a flexible automatic frequency control (AFC) design supporting transmit diversity are presented. Aspects of the system may include one or more circuits that enable computation of at least one frequency error value based on one or more previous computed frequency error values, current received symbols, and/or corresponding previously received symbols. A weighted sum may be computed from a plurality of computed frequency error values. A current demodulation frequency may be adjusted based on the computed weighted sum. The adjusted demodulation frequency may be utilized for receiving one or more subsequent symbols.

41 Claims, 8 Drawing Sheets

METHOD AND SYSTEM FOR A FLEXIBLE AUTOMATIC FREQUENCY CONTROL (AFC) DESIGN SUPPORTING TRANSMIT DIVERSITY

CROSS-REFERENCE TO RELATED APPLICATIONS/INCORPORATION BY REFERENCE

This application makes reference to:

U.S. application Ser. No. 11/565,567 filed on even date herewith.

The above stated application is hereby incorporated herein by reference in its entirety.

FIELD OF THE INVENTION

Certain embodiments of the invention relate to wireless communication. More specifically, certain embodiments of the invention relate to a method and system for a flexible automatic frequency control (AFC) design supporting transmit diversity.

BACKGROUND OF THE INVENTION

Cellular communication systems provide wireless communication services in many populated areas of the world. While cellular communication systems were initially constructed to service voice communications, they are now called upon to support data communications as well. The demand for data communication services has exploded with the acceptance and widespread use of the Internet. While data communications have historically been serviced via wired connections, cellular users now demand that their wireless units also support data communications. Many wireless subscribers now expect to "surf" the Internet, access email, and perform other data communication activities using their cellular phones, wireless personal data assistants, wirelessly linked notebook computers, and/or other wireless devices. The demand for wireless communication system data communications continues to increase with time. Thus, existing wireless communication systems are currently being created or modified to service these burgeoning data communication demands.

Cellular networks include a network infrastructure that wirelessly communicates with wireless terminals within a respective service area. The network infrastructure typically includes a plurality of base stations dispersed throughout the service area, each of which supports wireless communications within a respective cell or set of sectors. The base stations may be coupled to base station controllers (BSCs), with each BSC serving a plurality of base stations. Each BSC is coupled to a mobile switching center (MSC). Each BSC also typically directly or indirectly coupled to the Internet.

In operation, each base station (BS) communicates with a plurality of wireless terminals operating in its cell/sectors. A BSC coupled to the base station routes voice communications between the MSC and the serving base station. The MSC routes the voice communication to another MSC or to the PSTN, for example. The BSCs route data communications between a servicing base station and a packet data network that may include or couple to the Internet. Transmissions from base stations to wireless terminals are referred to as "forward link or downlink" transmissions while transmissions from wireless terminals to base stations are referred to as "reverse link or uplink" transmissions.

Third generation (3G) cellular networks have been specifically designed to fulfill these future demands of the mobile Internet. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers need technologies that will allow them to increase downlink throughput and, in turn, offer advanced QoS capabilities and speeds that rival those delivered by cable modem and/or DSL service providers. In this regard, networks based on wideband CDMA (WCDMA) technology may make the delivery of data to end users a more feasible option for today's wireless carriers.

A mobile handset may synchronize its timing to the timing of a base station to enable the mobile handset to communicate via the network. In some conventional WCDMA networks, synchronization and timing acquisition between a mobile handset and a base station, or coarse acquisition, may comprise at least a 3-step process. The first step is referred to as a synchronization timing process. The second step may be referred to as a frame synchronization process. The third step may involve determining the scrambling code utilized by the base station that was identified during the slot synchronization and frame synchronization processes. A signal scrambled at a base station by utilizing a selected scrambling code may be unscrambled by utilizing the selected scrambling code at the mobile terminal. The mobile terminal may utilize a plurality of potential scrambling codes when determining which of the potential scrambling codes is utilized at the identified base station. The mobile terminal may utilize the selected scrambling code to unscramble a spread spectrum signal received from the base station.

After establishing coarse acquisition, the mobile handset may need to perform fine acquisition to adjust timing signals at the mobile handset to maintain synchronization with the base station in spite of imperfections in oscillator circuitry in mobile terminals, Doppler effect frequency shifts that may occur at some mobile terminals, and/or other sources that may cause a loss of timing synchronization between the mobile handset and the base station.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for a flexible automatic frequency control (AFC) design supporting transmit diversity, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a flexible automatic frequency control (AFC) design supporting transmit diversity. Various embodiments of the invention may comprise a method and a system that utilizes an automatic frequency control (AFC) loop to automatically adjust a demodulating frequency, which is utilized to demodulate received signals at a mobile system. The AFC loop may provide a means for compensating for frequency offsets that may occur between received signals. The adjustment value utilized in the AFC loop may be computed based on computed frequency offset values. In various embodiments of the invention, multiple modes may be supported, which permit the length of data (as measured in chips), utilized for computing the adjustment values, to be selected based on the size of a computed frequency offset values.

Figure 1:
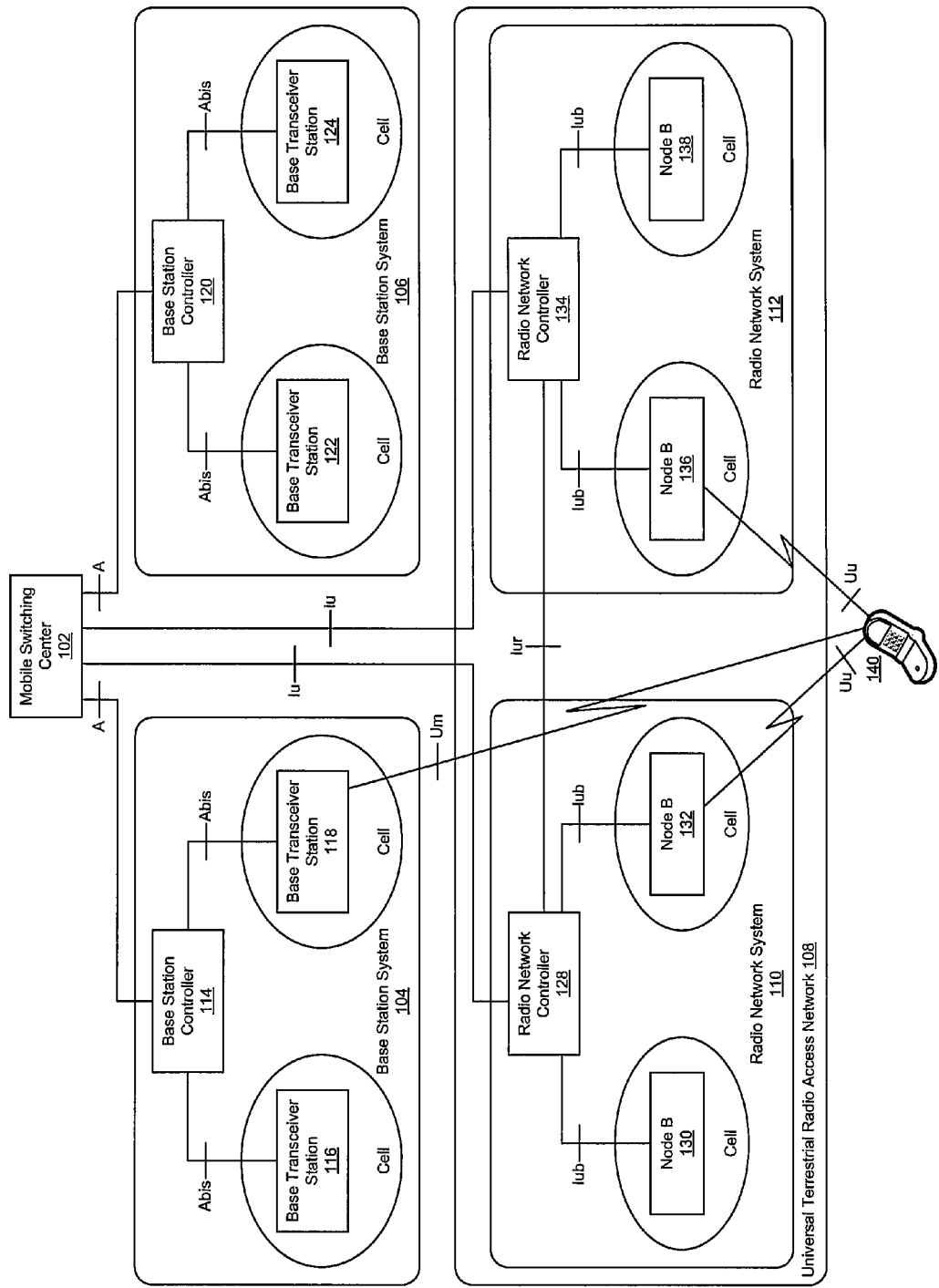
FIG. 1 illustrates an exemplary $3^{rd}$ generation (3G) GSM network, which may be utilized in connection with an embodiment of the invention.

FIG. 1 illustrates an exemplary $3^{rd}$ generation (3G) GSM network, which may be utilized in connection with an embodiment of the invention. Referring to FIG. 1 there is shown a mobile switching center (MSC) 102, a base station system (BSS) 104, a BSS 106, a universal terrestrial radio access network (UTRAN) 108, and a mobile station (MS) 140. The BSS 104 may comprise a base station controller (BSC) 114, a base transceiver station (BTS) 116, and a BTS 118. The BSS 106 may comprise a BSC 120, a BTS 122, and a BTS 124. The UTRAN 108 may comprise a radio network system (RNS) 110, and an RNS 112. The RNS 110 may comprise a radio network controller (RNC) 128, a node B 130, and a node B 132. The RNS 112 may comprise a RNC 134, a node B 136, and a node B 138.

The MSC 102 may be coupled to the BSC 114 via an A interface, and to the BSC 120 via an A interface. The MSC 102 may be coupled to the RNC 128 via an Iu interface. The MSC 102 may be coupled to the RNC 134 via an Iu interface. The BSC 114 may be coupled to the BTS 116 via an Abis interface. The BSC 114 may be coupled to the BTS 118 via an Abis interface. The BSC 120 may be coupled to the BTS 122 via an Abis interface and to the BTS 124 via an Abis interface. The RNC 128 may be coupled to the node B 130 via an Iub interface and to the node B 132 via an Iub interface. The RNC 134 may be coupled to the node B 136 via an Iub interface, and to the node B 138 via an Iub interface. The RNC 128 may be coupled to the RNC 134 via an Iur interface. The MS 140 may be coupled to a BTS via a Um interface. The MS 140 may be coupled to a node B via a Uu interface.

The elements of a $2^{nd}$ generation wireless network (such as a GSM network, IS-95 network, or WCDMA network, for example) may comprise one or more MSC 102 elements, and one or more BSS 104 elements. The elements of a 3G GSM network may comprise one or more MSC 102 elements, one or more BSS 104 elements, and one or more UTRAN 108 elements. The MSC 102 may comprise suitable circuitry, logic, and/or code that may enable switching functions within at least a portion of a wireless communications network. The MSC 102 may control the operation of BSC, BTS, RNC, and/or node B elements within a GSM network that enable a subscriber utilizing an MS 140 to communicate with other subscribers on the GSM network, or with subscribers on other wireless or wired networks. The MSC 102 may control the operation of the BSC 114, and BTSs 116 and 118 via an A interface. The MSC 102 may control the operation of the RNC 128, and node B elements 130 and 132 via an Iu interface. The MS 140 may communicate with a BTS 118 element via a Um interface. The MS 140 may communicate with a node B 132 element via a Uu interface.

The BSC 114 may comprise suitable circuitry, logic, and/or code that may control the operation of one or more BTS 116 elements within a BSS 104 and enable a subscriber to utilize wireless communications services within at least a portion of a service area. The area in which the subscriber may utilize the BSC 114 to receive wireless communications services may comprise a BSC area. The BSC 114 may control the operation of a BTS 116 element via an Abis interface. The BTS 116 may comprise suitable circuitry, logic, and/or code that may enable a subscriber to utilize wireless communications services within at least a portion of a BSC area. The area in which the subscriber may utilize the BTS 116 to receive wireless communications service may comprise a cell. The BTS 116 may comprise radio transceivers that may be utilized to wirelessly communicate with one or more MS 140 elements. The BTS 116 may select one or more frequencies that may be utilized to establish one or more RF channels. The RF channel(s) may be utilized to communicate with an MS 140 element. The BTS 116 may transmit information to an MS 140 element via a downlink channel. The BTS 116 may receive information from an MS 140 element via an uplink channel.

The RNC 128 may comprise suitable circuitry, logic, and/or code that may control the operation of one or more node B 130 elements within an RNS 110 and enable a subscriber to utilize wireless communications services within at least a portion of a service area. The area in which the subscriber may utilize the RNC 128 to receive wireless communications services may comprise an RNC area. The RNC 128 may control the operation of a node B 130 element via an Iub interface. The node B 130 may comprise suitable circuitry, logic, and/or code that may enable a subscriber to utilize wireless communications services within at least a portion of an RNC area. The area in which the subscriber may utilize the node B 130 to receive wireless communications service may comprise a cell. The node B 130 may comprise radio transceivers that may be utilized to wirelessly communicate with one or more MS 140 elements. The node B 130 may select one or more frequencies that may be utilized to establish one or more RF channels. The RF channel(s) may be utilized to communicate with an MS 140 element. The node B 130 may transmit information to an MS 140 element via a downlink channel. The node B 130 may receive information from an MS 140 element via an uplink channel.

The MS 140 may comprise suitable circuitry, logic, and/or code that may enable a subscriber to originate and/or receive calls and/or other services via a wireless network. The MS 140 may provide radio control management by receiving information via one or more downlink channels and/or by transmitting information via one or more uplink channels.

The MS 140 may decode information received wirelessly and/or encode information to be transmitted wirelessly. The MS 140 may provide a user interface, comprising a keypad, and visual and/or audio input and output that may enable a user to originate and/or receive voice, data, and/or video communications via the wireless network. The MS 140 may provide mobility management by enabling a subscriber engaged in an established call to move from an area served by a current cell to an area served by a subsequent cell without losing the ability to subsequently continue to communicate via the established call.

The BTS 118, 122, and 124 may be substantially as described for the BTS 116. The BSC 120 may be substantially as described for the BSC 114. The BSS 106 may be substantially as described for the BSS 104. The node B 132, 136, and 138 may be substantially as described for the node B 130. The RNC 134 may be substantially as described for the RNC 128. The RNS 112 may be substantially as described for the RNS 110.

In operation, a MS 140 may be required to establish synchronization and timing acquisition, or coarse acquisition, with a BTS 118 or node B 132 prior to being able to establish a new call within the MSC area served by the MSC 102. After establishing coarse acquisition, the MS 140 may continuously perform fine acquisition. Coarse acquisition may enable a MS 140 to synchronize its local timing to the timing of a BTS or node B to within a determined tolerance, for example within a 1 chip time interval. The synchronization may be based on timing delays associated with the time instant at which signals are transmitted by the BTS 118 or node B 132, and the time instant at which a corresponding signal is received by the MS 140. Fine acquisition may enable the MS 140 to adjust to timing or frequency offsets that may occur in signals received from a BTS 118 or node B 132 that may be due to causes such as Doppler effects arising from relative changes in location between the MS 140 and the BTS or node B, or offset that may arise due to component drifts in local oscillator circuitry within the MS 140, BTS, or node B.

Each of the BTSs and/or node Bs may transmit pilot symbols via a downlink channel such as the synchronization channel (SCH). For example, the MS 140 may receive SCH signals from BTS 118, node B 132, and node B 136. The MS 140 may measure the signal strength of each of the downlink channels received by one or more BTSs and/or node Bs and select the downlink channel with the strongest received signal, for example node B 132. The MS 140 may initiate coarse acquisition the node B 132, which transmitted the selected signal.

The first step in an exemplary coarse acquisition process in a WCDMA system may be referred to as a slot timing process. A WCDMA frame may comprise 15 slots. A WCMDA frame may also be referred to as a spread spectrum frame, or a frame. The individual slots within a 15-slot frame may be labeled slot 0, slot 1, slot 2, . . . , slot 14. Slots may be transmitted at a 1,500 Hz rate, or 1 slot per ⅔ milliseconds (ms). During each slot, 2,560 chips may be transmitted for a chip rate of about 3.84 mega chips/second (Mcps). The transmitted slot may contain a primary synchronization code (PSC). The PSC may comprise the first 256 chips within a given slot. A single PSC may be transmitted during each of the 15 slots within a WCDMA frame, such that the PSC transmitted during slot 0 may contain the same information as the PSC transmitted during slots 1, 2, . . . , 14. The PSC may be utilized to determine slot timing within the communication system. The determined slot timing may correspond to a primary synchronization position. When slot timing is achieved, the node B 132 and MS 140 may be able to synchronize clock timing, based on the primary synchronization position, and to determine a time instant that indicates the beginning of a transmitted slot.

While slot synchronization may enable a MS 140 and node B 132 to mutually determine a time instant corresponding to the beginning of transmission of a slot, slot synchronization may not enable the MS 140, for example, to determine when the node B 132 is transmitting slot 0 within a WCDMA frame.

A second step in the synchronization and timing acquisition process may be referred to as a frame timing process. A transmitted slot may also comprise a secondary synchronization code (SSC). An SSC may be utilized to determine which slot within a WCDMA frame corresponds to slot 0, slot 1, slot 2, . . . , or slot 14. The SSC may comprise a sequence of 15 slots such that an $SSC_0$ may represent an SSC transmitted during slot 0, an $SSC_1$ may represent an SSC transmitted during slot 1, an $SSC_2$ may represent an SSC transmitted during slot 2, and an $SSC_{14}$ may represent an SSC transmitted during slot 14, for example. When slot timing and frame timing are achieved, the node B 132 and MS 140 may be able to synchronize clock timing and to determine time instants that indicate the beginning of a transmitted slot, which may indicate the beginning of a transmitted WCDMA frame.

After achieving frame timing, a MS 140 may be able to identify an individual BTS or node B among a plurality of BTSs or node Bs that may transmit a WCDMA signal to the MS 140. However, an individual node B 132 within a WCDMA network may transmit a signal that is scrambled by a spreading code. A scrambling code may comprise a binary sequence of bits that may be utilized to scramble a signal to produce a spread spectrum signal. The signal may be scrambled by utilizing a Gold code, for example. The node B 132 may select a scrambling code from a plurality of potential scrambling codes. The scrambling code may be a Gold code selected from among a group of 8 potential Gold codes that may be utilized to scramble a signal transmitted by the node B 132, for example.

In a third step in the synchronization and timing acquisition process, the MS 140 may determine which scrambling code may be utilized by the individual node B 132 that was identified during the slot timing and frame timing processes. A signal, scrambled at the node B 132 by utilizing a selected scrambling code, may be unscrambled by utilizing a corresponding descrambling code at the MS 140. The MS 140 may select the corresponding descrambling code by utilizing different candidate descrambling codes to descramble a signal transmitted by the node B 132 via the common pilot channel (CPICH), for example. The MS 140 may determine a signal energy associated with application of each potential descrambling code to the received signal, for example. Based on a signal energy comparison, for example, the MS 140 may select a descrambling code utilized at the identified node B 132. The MS 140 may also utilize the selected descrambling code to unscramble a spread spectrum signal received from the node B 132.

A subscriber may subsequently utilize the MS 140 to attempt to initiate a new call within the MSC area served by the MSC 102 via a node B 132 element. The MSC 102 may utilize the Iu interface to receive information in connection with the attempted call initiation from an RNC 128 element. The information may identify the location of the subscriber by indicating a specific cell associated with a node B 132 element that received the request from the MS 140 associated with the new call attempt. If the attempted call is accepted, the MSC 102 may indicate to the RNC 128 element that the new call attempt is to be accepted via the Iu interface.

In response, the RNC 128 element may allocate resources at the corresponding node B 132 element, such as a transceiver assignment and one or more downlink and/or uplink frequency assignments, which may be utilized for communicating with the MS 140. The RNC 128 element may also assign transmitting power levels and/or one or more orthogonal variable spreading factor (OVSF) codes that may be utilized during communications between the node B 132 element and the MS 140 via an assigned RF channel. The RNC 128 element may communicate these assignments to the corresponding node B 132 element via the Iub interface. The node B 132 element may subsequently utilize the assigned resources when communicating with the MS 140 via the Uu interface. The MS 140 may utilize wideband code division multiple access (W-CDMA) when utilizing an RF channel to communicate with the node B 132 element via the Uu interface.

During an existing call the MS 140 may be in motion relative to the node B 132 element. This may induce Doppler frequency shifts such that the Doppler frequency associated with one received symbol may differ from the Doppler frequency associated with a subsequent or previous received symbol. This difference in Doppler frequencies among the received symbols may in turn result in a frequency offset between received symbols. The frequency offset may produce a corresponding relative timing phase shift between received symbols. During demodulation of received symbols at the MS 140, relative frequency offsets may result in erroneous detection of one or more signal amplitudes and/or phases associated with a received signal. This may correspond to shifts in the constellation utilized for demodulating the received symbols. The constellation shifts may result in a symbol, that maps data to a given constellation point at a transmitting node B 132, being received by the MS 140, which maps the received symbol to an incorrect constellation point. Consequently, the received data may be different from the transmitted data. Thus, if the MS 140 does not detect, and compensate, the relative frequency offsets between received symbols, data transmitted from the node B 132 may be corrupted during demodulation at the MS 140.

Various embodiments of the invention may provide a method for fine acquisition that enables detection of relative frequency offsets, with corresponding adjustments in demodulation frequencies utilized at a MS 140. The adjustment in demodulation frequency may be referred to as automatic frequency control (AFC). Various embodiments of the invention may be practiced when receiving signals from BTSs or node Bs that utilize space time transmit diversity (STTD), that do not utilize STTD, or which utilize other conceivable methods of transmit diversity.

Figure 2:
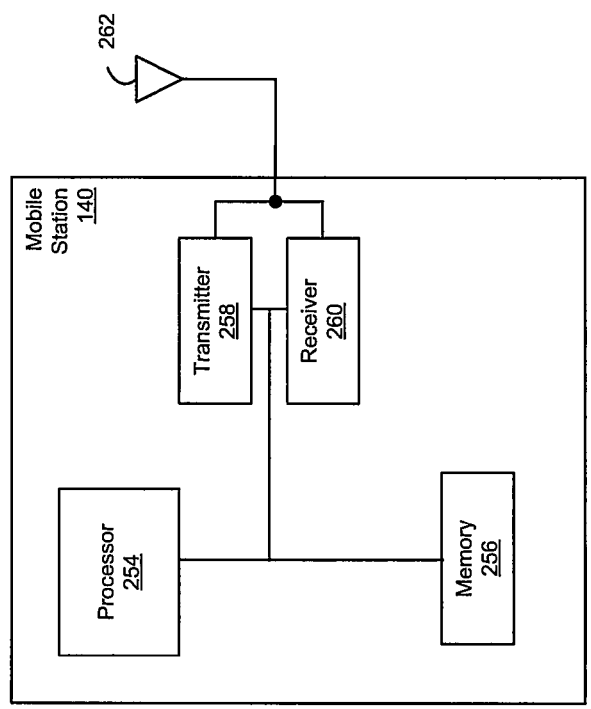
FIG. 2 is a block diagram of an exemplary mobile station, which may be utilized in connection with an embodiment of the invention.

FIG. 2 is a block diagram of an exemplary mobile station, which may be utilized in connection with an embodiment of the invention. Referring to FIG. 2, there is shown a mobile station (MS) 140, and an antenna 262. The MS 140 may comprise a processor 254, memory 256, a transmitter 258, and a receiver 260. The processor 254 may comprise suitable logic, circuitry, and/or code that may enable processing of information and/or data associated with the transmission and reception of signals at the MS 140. The processor 254 may, for example, compute frequency adjustment values for adjustment of a current demodulation frequency utilized by the receiver 260. The memory 256 may comprise suitable logic, circuitry, and/or code that may store data and/or control information that may be utilized in the operation of at least a portion of the MS 140. For example, the memory 256 may be utilized to store intermediate results of calculations related to AFC.

The transmitter 258 may comprise suitable circuitry, logic, and/or code that may be utilized to transmit signals wirelessly. The transmitter 258 may perform coding functions, signal modulation, and/or signal amplification. The receiver 260 may comprise suitable circuitry, logic, and/or code that may be utilized to receive wireless signals. The receiver 260 may perform decoding functions, signal demodulation, and/or signal amplification. The receiver 260 may also detect frequency offsets based on received signals. The antenna 262 may comprise suitable circuitry, logic, and/or code that may enable the reception and/or transmission of wireless signals.

Figure 3:
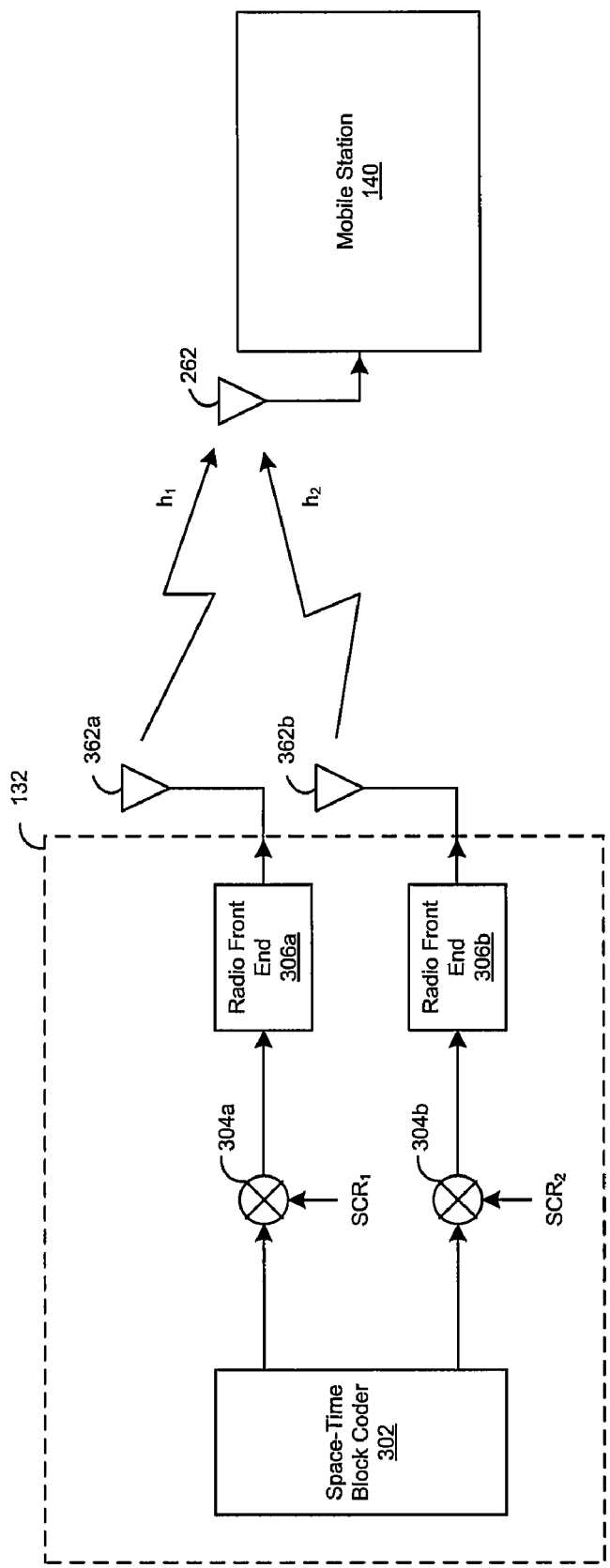
FIG. 3 is an exemplary system for transmit diversity, which may be utilized in connection with an embodiment of the invention.

FIG. 3 is an exemplary system for transmit diversity, which may be utilized in connection with an embodiment of the invention. Referring to FIG. 3, there is shown a node B element 132, a plurality of transmitting antennas 362*a* and 362*b*, a mobile station (MS) 140, and a receiving antenna 262. The node B element 132 may comprise a space-time block coder (STBC) 302, a plurality of chip generator blocks 304*a* and 304*b*, and a plurality of radio front ends 306*a* and 306*b*. The transmitting antennas 362*a* and 362*b* may be substantially similar to the antenna 262.

The STBC 302 may comprise suitable logic, circuitry, and/or code that may enable output of symbols to at least one of plurality of space time streams at a given time instant. Each symbol may comprise constellation mapped data to be transmitted by the node B element 132. An exemplary node B element 132 may utilize a quadrature phase shift keying (QPSK) constellation for mapping at least a portion of the data to a corresponding symbol. At a current time instant, the STBC 302 may simultaneously output a value of the symbol on a first space time stream, and on a second space time stream. At a subsequent time instant, the STBC 302 may output the value of the symbol on a first space time stream, while outputting a value that is a complex conjugate of the symbol, or a negative value of the complex conjugate of the symbol, on a second space time stream.

The chip generator block 304*a* may comprise suitable logic, circuitry, and/or code that may enable generating a chip level output signal based on input symbols from a space time stream, and a scrambling code $SCR_1$. The chip level output signal may represent a spread spectrum version of the input symbols based on a spreading factor (SF) that is determined by the chip generator function implemented in the chip generator block 304*a*. The chip generator block 304*b* may be substantially similar to the chip generator block 304*a*. The chip generator block 304*b* may utilize a scrambling code $SCR_2$.

The RFE block 306*a* may comprise suitable logic, circuitry, and/or code that may enable generation of an RF signal from a chip level output signal. The RFE block 306*a* may generate the RF signal by utilizing at least one frequency carrier signal to modulate the RF chain signal. The RFE block 306*a* may generate an RF signal that comprises an in-phase (I) component, and/or a quadrature phase (Q) component. The modulated signal may be transmitted via the transmitting antenna 362*a*. The RFE block 306*b* may be substantially similar to the RFE block 306*a*.

In operation, a signal transmitted from the transmitting antenna 362*a*, $x_1$, may be received at the MS 140 via the receiving antenna 162. Similarly, a signal transmitted from the transmitting antenna 362*b*, $x_2$, may also be received at the MS 140 via the receiving antenna 262. The signal $x_1$ may be subjected to signal distortions, or fading, while being transmitted via the wireless communications medium between the transmitting antenna 362*a*, and the receiving antenna 262. The fading characteristic of the signal $x_1$ may be represented by the channel estimate $h_1$. Similarly, the signal $x_2$ may be subjected to fading while being transmitted via the wireless communications medium between the transmitting antenna 362b, and the receiving antenna 262. The fading characteristic of the signal $x_2$ may be represented by the channel estimate $h_2$. Thus, the signal received by the MS 140, y, may be represented as shown in the following equation:

$$y(t) = h_1 \cdot x_1(t^-) + h_2 \cdot x_2(t^-) + n(t) \qquad \text{Equation [1]}$$

where n may represent noise associated with the wireless communications medium, t represents a time at which the signal y is received at the MS 140, and $t^-$ represents a time $t-\delta$, which represents an approximate time at which the signals $x_1$ and $x_2$ were transmitted from the node B element 132.

In many wireless communication environments, portions of the total energy of the transmitted signal $x_1$ depart the transmitting antenna 362a at a plurality of angles of departure (AOD). During transmission via the wireless communications medium, the different portions of the transmitted signal $x_1$ may travel via different paths to reach the receiving antenna 262. The number of different paths, and/or the length of each path, may depend upon the number of obstacles along the path, such as buildings, that may deflect the portion of the transmitted signal. The different portions of the transmitted signal may arrive at the receiving antenna 262 at various angles of arrival (AOA). Collectively, the plurality of portions of the transmitted signal, which arrive at the receiving antenna 262, may be referred to as a multipath, and each of the portions of the transmitted signal may be referred to as an individual path signal, $x_1^j$, where j represents an index for an individual path signal in a multipath. The various individual path signals may arrive at the receiving antenna 262 at different times. Thus, equation [1] may be modified to represent individual path signals as shown in the following equation:

$$y(t+(j-1)\cdot\epsilon) = h_1^j \cdot x_1^j(t^-) + h_2^j \cdot x_2^j(t^-) + n^j(t) \qquad \text{Equation [2]}$$

where $\epsilon$ may represent a time interval between received individual path signals as indexed by the variable j.

Figure 4:
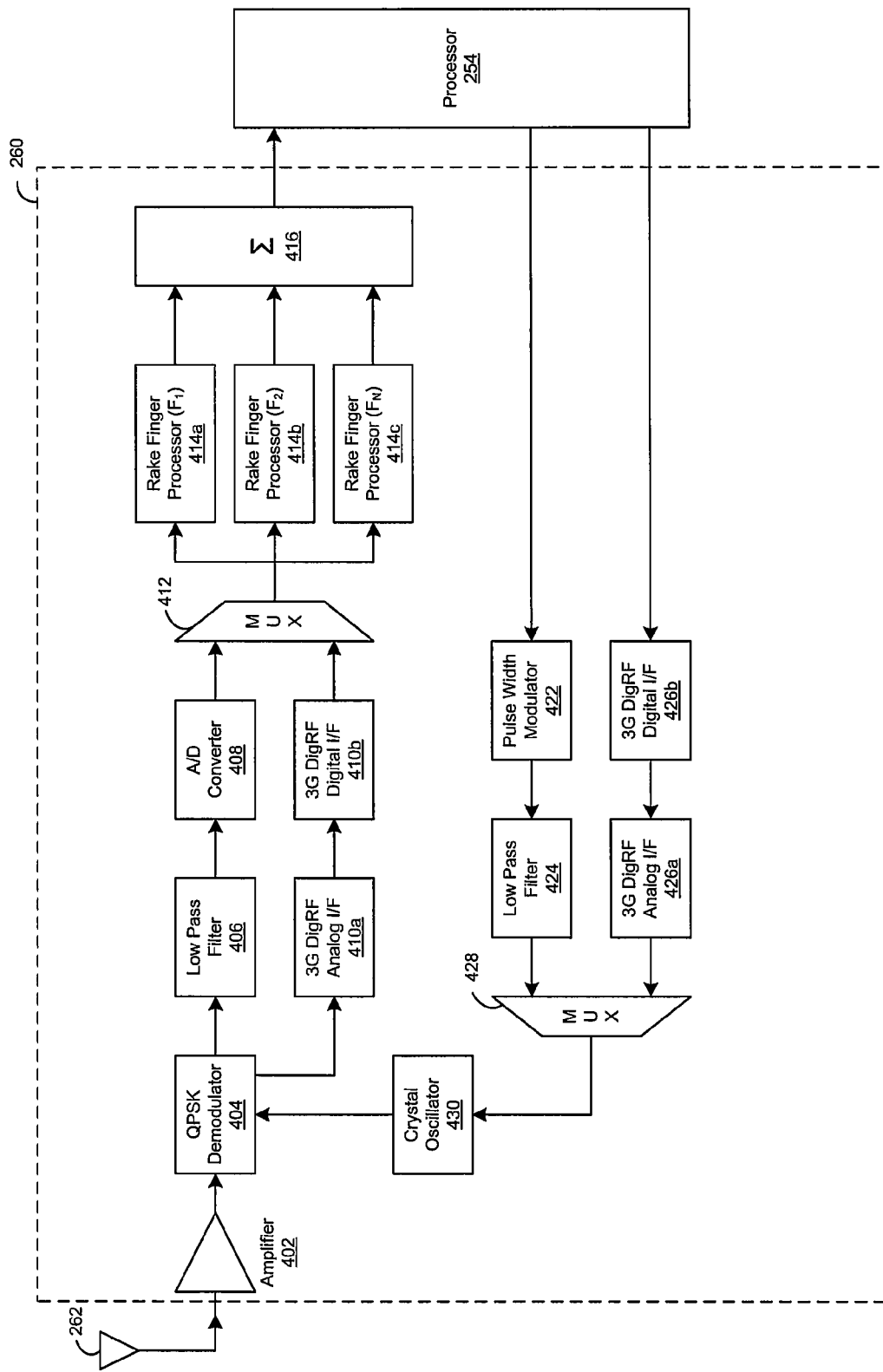
FIG. 4 is an exemplary receiver, in accordance with an embodiment of the invention.

FIG. 4 is an exemplary receiver, in accordance with an embodiment of the invention. Referring to FIG. 4, there is shown a receiving antenna 262, a receiver 260, and a processor 254. The processor 254 may be substantially as described in FIG. 2. The receiver 260 may comprise an amplifier 402, a quadrature phase shift keying (QPSK) demodulator 404, low pass filters (LPF) 406 and 424, an analog to digital (A/D) converter 408, 3G digital radio frequency (DigRF) analog interfaces (I/F) 410a and 426a, 3G DigRF digital I/F 410b and 426b, multiplexers (MUXs) 412 and 428, a plurality of rake finger processors 414a, 414b, and 414c, a summing combiner 416, a crystal oscillator 430, and a pulse width modulator 422.

The amplifier 402 may comprise suitable logic, circuitry, and/or code that may enable amplification of an RF signal from the receiving antenna 262. The QPSK demodulator 404 may comprise suitable logic, circuitry, and/or code that may enable demodulation of an RF signal to a baseband signal. In various embodiments of the invention, the QPSK demodulator 404 may demodulate the RF signal to an intermediate frequency (IF) signal and subsequently convert the IF signal to the baseband signal. The baseband signal may comprise an I component and/or a Q component, each of which may, in turn, comprise a plurality of symbols. The QPSK demodulator 404 may convert symbols from corresponding I and/or Q components to analog signal levels based on a QPSK constellation. Various embodiments of the invention may not be practiced with other constellation types, for example binary phase shift keying (BPSK).

The LPF 406 may comprise suitable logic, circuitry, and/or code that may band limit the baseband signal from the QPSK demodulator 404 by attenuating amplitudes of frequency components in the baseband signal that are at frequencies, which are lower than the cutoff frequency associated with the LPF 406.

The A/D converter 408 may comprise suitable logic, circuitry, and/or code that may enable individual analog signal levels in a band limited baseband signal to be converted to a binary value. For example, when the analog signal levels are generated based on QPSK demodulation, each of the analog signal levels may be converted to 2 chips. Each chip may be represented in a voltage pulse of a determined time duration and determined voltage level. For example, a binary "1" may be represented by a voltage level of 3 volts, while a binary "0" may be represented by a voltage level of 0 volts. The A/D converter 408 may generate a digital baseband signal comprising a plurality of voltage pulses generated from the band limited baseband signal.

Various embodiments of the invention may also be practiced in conjunction with 3G DigRF I/F specifications. In this regard, 3G DigRF I/F specifications may define a standardized means for converting an RF signal to a baseband signal. The 3G DigRF I/F may be represented as comprising an analog portion, as shown by the 3G DigRF analog I/F 410a, and a 3G DigRF digital I/F 410b. The 3G DigRF analog I/F 410a may receive an analog RF signal. The 3G DigRF analog I/F 410a may generate a signal, based on 3G DigRF I/F specifications, that is communicated to the 3G DigRF digital I/F 410b. The 3G DigRF digital I/F 410b may generate a digital baseband signal.

The MUX 412 may comprise suitable logic, circuitry, and/or code that may enable selection of a digital baseband signal that is generated from the A/D converter 408, or from the 3G DigRF Digital I/F 410b. The MUX 412 may select a digital baseband signal in response to a control signal from the processor 254.

The digital baseband signal may comprise a sequence of complex signal values $y_n$, where $y_n$ represents approximate complex values of the received signal y(t) (as represented in Equation [1]) at time instants t=nT, where T represents a sampling time interval, and n represents an index value. Each value $y_n$ may represent chips, which may be descrambled and/or despread by utilizing a descrambling code and/or a despreading code to derive at least a portion of a received symbol $d_n$.

In various embodiments of the invention, the received symbol $d_n$ may comprise a selected number of received signal values $y_n$ that may be utilized for computing a frequency offset value relative to at least one previously received symbol, and/or at least one subsequently received symbol. When each value $y_n$ is descrambled and/or despread to generate a portion of a received data symbol, the symbol $d_n$ may be derived by summing each of the constituent descrambled and/or despread values $y_n^k$, where k represents a constituent index to the data symbol $d_n$. For example, the data symbol $d_n$ may be derived by concatenating individual constituent descrambled and despread values $y_n^k$.

The rake finger processor 414a may comprise suitable logic, circuitry, and/or code that may enable reception, descrambling, and/or despreading of received digital baseband signals. In an exemplary embodiment of the invention, the rake finger processor 414a may generate descrambled and/or despread values $y_n$ that may be utilized to derive each received data symbol. The rake finger processor 414a may also generate descrambled and/or despread values $y_n^k$, which may be summed to derive each received symbol. The rake finger processor 414a may enable reception of signals corresponding to individual path signal j=1 in equation [2].

In a system that utilizes STTD, the rake finger processor 414a may utilize a plurality of descrambling and/or despreading codes for descrambling and/or despreading $y_n$, or $y_n^k$. For example, a first symbol may be derived based on the descrambling and/or despreading product $y_n \otimes SCR_1^*$, where $SCR_1^*$ may correspond to a descrambling and/or despreading code that corresponds to the scrambling or spreading code $SCR_1$. The first symbol may be approximately equal to $h_1 \cdot x_1(t^-)$. A second symbol may be derived based on the descrambling and/or despreading product $y_n \otimes SCR_2^*$, where $SCR_2^*$ may correspond to a descrambling and/or despreading code that corresponds to the scrambling and/or spreading code $SCR_2$. The second symbol may be approximately equal to $h_2 \cdot x_2(t^-)$. In various embodiments of the invention, a weighted sum may be computed based on the first and second symbols.

The rake finger processor 414b may be substantially similar to the rake finger processor 414a. The rake finger processor 414b may enable reception of signals corresponding to individual path signal j=2 in equation [2]. The rake finger processor 414c may be substantially similar to the rake finger processor 414a. The rake finger processor 414c may enable reception of signals corresponding to individual path signal j=3 in equation [2].

The summing combiner 416 may comprise suitable logic, circuitry, and/or code that may enable computing a weighted average of values generated by the plurality of rake finger processors 414a, 414b, and 414c. In an exemplary embodiment of the invention, the summing combiner 416 may enable computation of a weighted average that is based on maximal ratio combining (MRC) of the values generated by the rake finger processors. In this exemplary embodiment of the invention, the rake finger processors may each generate one or more frequency offset values (for example, one frequency offset value for each received signal in an STTD system). In another exemplary embodiment of the invention, the summing combiner 416 may enable computation of a weighted average that is based on equal gain combining (EGC) of the values generated by the rake finger processors. In this exemplary embodiment of the invention, the rake finger processors may each generate one or more differential values.

The pulse width modulator 422 may comprise suitable logic, circuitry, and/or code that may enable generation of a pulse train signal where the time duration, or width, of an individual pulse may be determined based on an input signal from the processor 254. The input signal from the processor 254 may be determined based on a weighted average signal received from the summing combiner 416. The input signal may comprise an adjustment value. The time interval between rising edges of consecutive pulses may be constant. In various embodiments of the invention, the pulse width modulator 422 may be replaced by a pulse density modulator. The pulse density modulator may enable generation of a pulse train signal where the time interval between rising edges of consecutive pulses may be determined based on the input signal from the processor 254. The width of individual pulses may be constant. The LPF 424 may be substantially similar to the LPF 406. The LPF 424 may enable low pass filtering of the signal generated by the pulse width modulator 422.

The 3G DigRF analog I/F 426a may be substantially similar to the 3G DigRF analog I/F 410a. The 3G DigRF digital I/F 426b may be substantially similar to the 3G DigRF digital I/F 410b. The 3G DigRF digital I/F 426b may generate an output signal based on an input signal from the processor 254. The input signal from the processor 254 may be determined based on the weighted average signal received from the summing combiner 416. The input signal may comprise an adjustment value. The 3G DigRF analog I/F 426a may generate an analog signal based on an input signal from the 3G DigRF digital I/F 426b. The MUX 428 may be substantially similar to the MUX 412. The MUX 428 may enable selection of a signal from the LPF 424, or from the 3G DigRF analog I/F 426a.

The crystal oscillator 430 may comprise suitable logic, circuitry, and/or code that may enable generation of a demodulator signal whose frequency may be adjusted based on the selected signal received from the MUX 428. The demodulator signal may be utilized by the QPSK demodulator 404 to demodulate subsequent received signals.

In operation, the QPSK demodulator 404 may utilize a current demodulation frequency, associated with the demodulator signal received from the crystal oscillator 430, to demodulate a current received signal y(t). Based the current received signal, and one or more previously received signals, each of the rake finger processors 414a, 414b, and/or 414c may compute one or more frequency offset values, or one or more difference values. The summing combiner 416 may compute a weighted average of the output signals from the rake finger processors that is communicated to the processor 254. The processor 254 may utilize the weighted average to compute a frequency offset value and/or to compute an adjustment value to be utilized for adjusting the demodulating frequency of the demodulator signal from the crystal oscillator 430. The processor 254 may communicate the computed adjustment value to the pulse width modulator 422 and/or the 3G DigRF digital I/F 426b, which may generate signals to effect an adjustment of the demodulation frequency of the demodulator signal from the crystal oscillator 430. The adjusted demodulation frequency may be utilized to demodulate subsequent received signals y(t).

Figure 5:
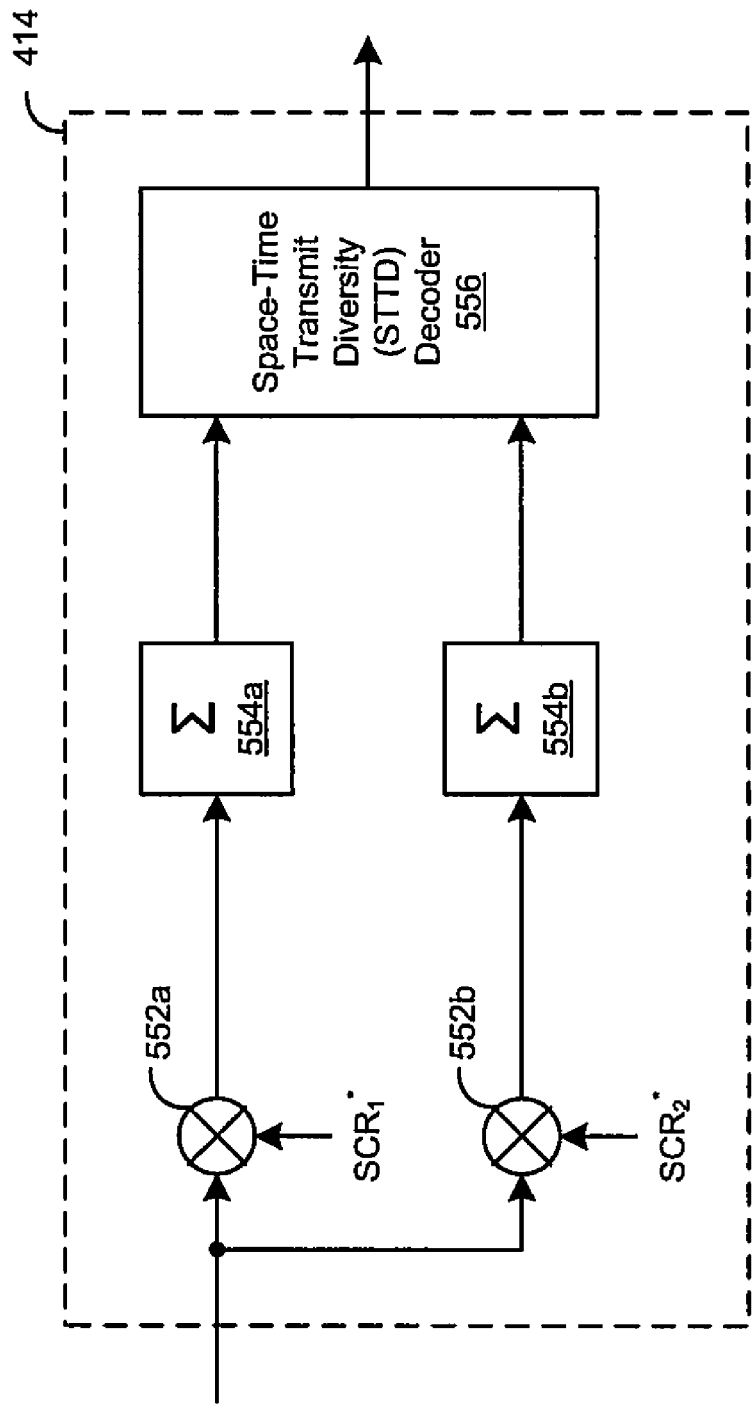
FIG. 5 is a block diagram of an exemplary rake finger processor, in accordance with an embodiment of an invention.

FIG. 5 is a block diagram of an exemplary rake finger processor, in accordance with an embodiment of an invention. Referring to FIG. 5, there is shown a rake finger processor 414. The rake finger processor 414 may represent any of the rake finger processors 414a, 414b, and/or 414c as shown in FIG. 4. The rake finger processor 414 may comprise a plurality of descrambler blocks 552a and 552b, a plurality of accumulator blocks 554a and 554b, and an STTD decoder block 556.

The descrambler block 552a may comprise suitable logic, circuitry, and/or code that may enable a chip level signal to be descrambled to generate a descrambled signal. The descrambler block 552a may utilize a descrambling code $SCR_1^*$ when descrambling the descrambled signal. In various embodiments of the invention, when the length of the descrambling code is less than the length of the symbol (as measured in chips) the descrambling code $SCR_1^*$ may enable generation of a portion of the symbol.

A chip level signal received by the descrambler block 552a in the rake finger processor 414a may be approximated based on equation [2] as in the following equation (for an individual path signal associated with the index j=1):

$$y(nT) \approx h_1^1 \cdot x_1^1(nT^-) + h_2^1 \cdot x_2^1(nT^-) + n^1(nT) \quad \text{Equation [3]}$$

The descrambled signal, $\hat{y}(nT)$, may be represented as in the following equation:

$$\hat{y}(nT) \approx h_1^1 \cdot x_1^1(nT^-) \otimes SCR_1^* + h_2^1 \cdot x_2^1(nT^-) \otimes SCR_1^* + n^1(nT) \otimes SCR_1^* \quad \text{Equation [4]}$$

The descrambled signal may comprise pilot symbols received via the CPICH, for example.

The descrambler block 552b may be substantially similar to the descrambler block 552a. The descrambler block 552b may utilize a descrambling code $SCR_2^*$ when descrambling the chip level signal.

The accumulator block 554a may comprise suitable logic, circuitry, and/or code that may enable detection of energy from a descrambled signal. When the descrambled signal contains energy from a plurality of signals, the accumulator block 554a may enable threshold detection of signal levels to select a signal from the plurality of signals. The accumulator block 554a may generate a symbol level signal. For example, the accumulator block 554a may generate a symbol level signal $d_n$ from a descrambled signal $\hat{y}(nT)$ (as shown in equation [4]) by computing a summation over the number of chips contained in the descrambling code as shown in the following equation (for a descrambling code comprising M chips):

$$d_n \cong \sum_{m=1}^{M} [h_1^1 \cdot x_1^1(nT^-)](m) \cdot scr_1^*(m) + \\ \sum_{m=1}^{M} [h_2^1 \cdot x_2^1(nT^-)](m) \cdot scr_1^*(m) + \sum_{m=1}^{M} n^1(nT)(m) \cdot scr_1^*(m)$$

Equation [5]

where m is an index for an individual chip, X(m) is a reference to an individual chip from the plurality of chips represented by the variable X, and [Y](m) is a reference to an individual chip from the plurality of chips represented by the expression [Y]. The value M may define an accumulation window.

For a chip level signal $x_1(t)$, which is generated by scrambling data $s_1$ with a scrambling code, $SCR_1$, and a chip level signal $x_2(t)$, which is generated by scrambling data $s_2$ with an orthogonal scrambling code, $SCR_2$, equation [5] may be approximated as shown in the following equation:

$$d_n \cong \sum_{m=1}^{M} h_1^1 \cdot \hat{s}_1(nT) \cdot scr_1(m) \cdot scr_1^*(m)$$

Equation [6a]

and $$d_n \cong h_1^1 \cdot \hat{s}_1(nT)$$

Equation [6b]

where $\hat{s}_1$ may represent an estimated value for the data $s_1$. In various embodiments of the invention, a value for the number of chips M may be selected. The accumulator block 554a may be configured for an accumulator window size, M, based on a control signal received from the processor 254, which may select the value for M.

The accumulator block 554b may be substantially similar to the accumulator block 554a.

The STTD decoder block 556 may comprise suitable logic, circuitry, and/or code that may enable computation of at least one frequency offset value and/or of at least one differential value. In an exemplary embodiment of the invention, the frequency offset values may be computed based on at least one current data symbol level signal, $d_n$, and a corresponding at least one previously received data symbol level signal, $d_m$. Each of the current data symbol level signals may be received from an accumulator block 554a or 554b. The STTD decoder block 556 may store previously received data symbol level signals for use when computing frequency offset values and/or differential values. The STTD decoder block 556 may compute frequency offset values and/or differential values based on a $j^{th}$ individual path signal $y(t+(j-1)\cdot\epsilon)$ as shown in equation [2].

Figure 6:
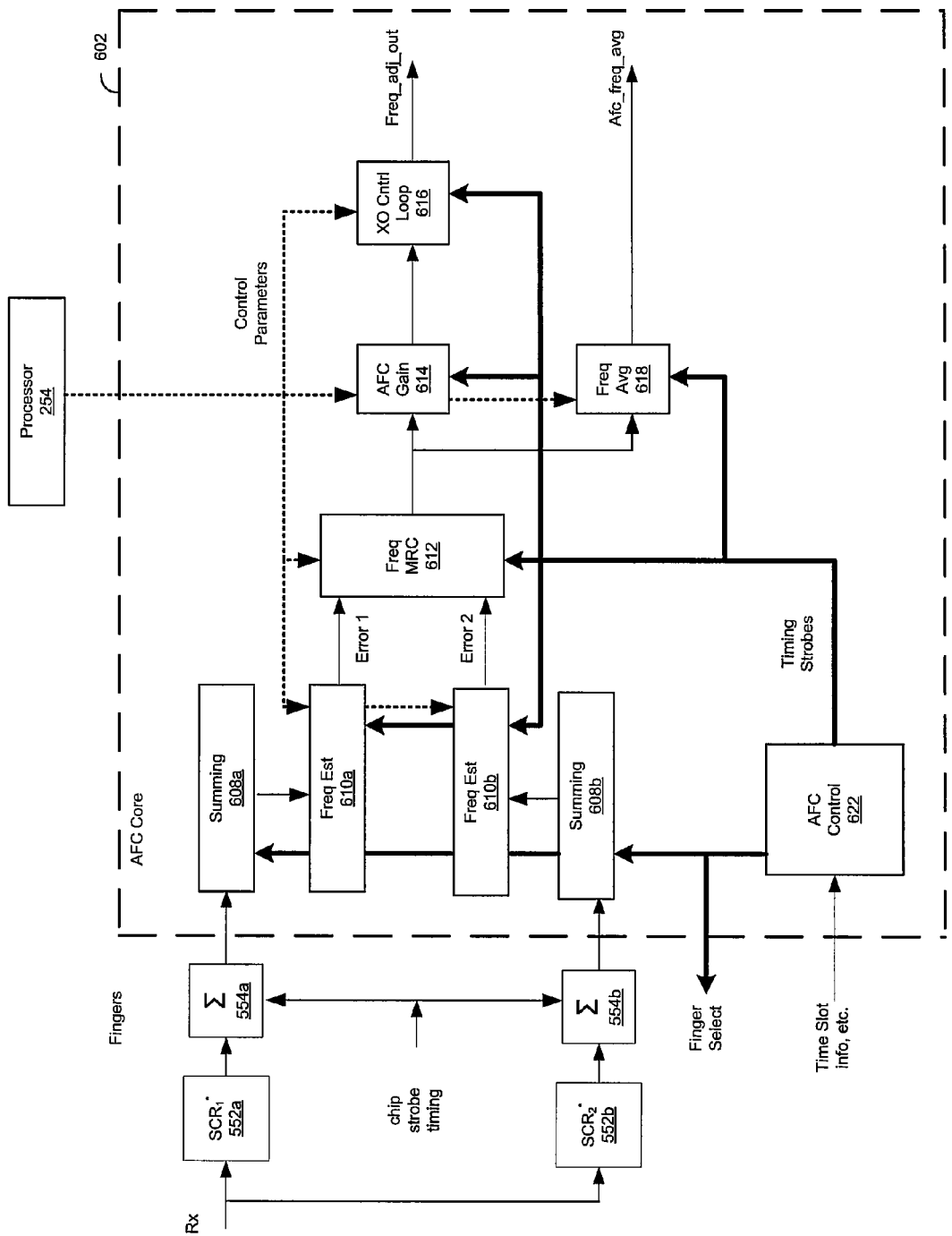
FIG. 6 is a block diagram of exemplary automatic frequency control core circuitry, in accordance with an embodiment of the invention.

FIG. 6 is a block diagram of exemplary automatic frequency control core circuitry, in accordance with an embodiment of the invention. Referring to FIG. 6, there is shown a plurality of descrambler blocks 552a and 552b, a plurality of accumulator blocks 554a and 554b, automatic frequency control (AFC) core circuitry 602, and a processor 254. The AFC core circuitry 602 may comprise a plurality of summing blocks 608a and 608b, a plurality of frequency estimator blocks 610a and 610b, a maximal ratio combining (MRC) block 612, an AFC gain block 614, a crystal oscillator (XO) control loop block 616, a frequency averaging block 618, and an AFC control block 622.

The AFC control block 622 may generate timing signals that may enable determination of timing for receiving individual path signals. These signals may enable timing for the activation of individual rake finger processors 414a, 414b, and/or 414c. The AFC control block 622 may also generate timing signals that may enable delineation of time slot boundaries within a WCDMA frame. The AFC control block 622 may communicate timing signals to the summing blocks 608a and 608b, the frequency estimator blocks 610a and 610b, the MRC block 612, the AFC gain block 614, the XO control loop block 616, and the frequency averaging block 618.

In various embodiments of the invention, the rake finger processors 414a, 414b, and/or 414c may be implemented as individual hardware modules, or the rake finger processors 414a, 414b, and/or 414c may be implemented as individual logical modules that utilize a common hardware module whose timing for selection of individual path signals is controlled by timing signals from the AFC control block 622.

Each of the plurality of descrambler blocks 552a and 552b may be substantially as described in FIG. 5. Each of the plurality of accumulator blocks 554a and 554b may be substantially as described in FIG. 5. Each of the accumulator blocks may receive a chip strobe timing signal that enables the accumulator block to generate a symbol level signal as shown in equation [5]. The chip strobe timing signal may enable the accumulator blocks to perform computations that span an accumulator window, wherein the size of the accumulator window may be determined based on the value of the variable M.

The summing block 608a may comprise suitable logic, circuitry, and/or code that may enable computation of a symbol based on a symbol level input signal received from the accumulator block 554a. When the accumulator window comprises at least a portion of a symbol, or symbol segment, the summing block 608a may sum individual received symbol segments from the accumulator block 554a to derive a full symbol. In an exemplary embodiment of the invention, the summing block 608a may comprise a first-in, first-out (FIFO) memory. The FIFO memory may generate the full symbol storing the received symbol segment, and/or by concatenating the received symbol segment from the accumulator block 554a to an intermediate symbol stored in the FIFO that comprises one or more symbol segments that were previously received.

The length of the full symbol stored in the summing block 608a, and the length of each received symbol, or symbol segment, from the accumulator block 554a may each be independently selected. The length of the symbol segment from the accumulator block 554a may be determined based on the accumulator window size parameter M. The value M may be selected based on, for example, noise considerations. Referring to equation [5], the second and third terms may represent noise in the descrambled signal. The second and third terms in equation [5] may be characterized as being stochastically distributed with a 0 mean value. Larger values of M may correspond to a greater probability that the second and third terms in equation [5] may tend toward their statistical mean values. Thus, the larger the value M, the smaller the noise component in equation [5] may be.

The length of the full symbol may be equal to M when the length of the full symbol is equal to the length of the accumulator window for the accumulator block 554a. Alternatively, the length of the full symbol may be measured based on the sum of the number of chips contained in each constituent symbol segment when the length of the full symbol is greater than the length of the accumulator window. The summing block 608a may receive timing strobe signals from the AFC control block 622 that enable the summing block 608a to delineate timing boundaries for receipt of individual path signals. The timing strobe signals may also enable the summing block 608a to delineate time slot boundaries within a WCDMA frame, for example. The summing block 608b may be substantially as described for the summing block 608a.

The frequency estimator block 610a may comprise suitable logic, circuitry, and/or code that may enable computation of a frequency error estimate based on a current received symbol, and on at least one previously received symbol. In an exemplary embodiment of the invention, the frequency estimator block 610a may receive a current symbol, which may be expressed in complex notation as shown in the following equation:

$$A_n \cdot \cos(\theta_n) + j \cdot A_n \cdot \sin(\theta_n) \qquad \text{Equation [7a]}$$

where $A_n$ may represent an amplitude for the current symbol and $\theta_n$ may represent a phase value for the current symbol. The frequency estimator block 610a may store a previously received symbol, which may be expressed in complex notation as shown in the following equation:

$$A_{n-1} \cdot \cos(\theta_{n-1}) + j \cdot A_{n-1} \cdot \sin(\theta_{n-1}) \qquad \text{Equation [7b]}$$

where $A_{n-1}$ may represent an amplitude for the previously data symbol and $\theta_{n-1}$ may represent a phase value for the previous symbol.

The frequency estimator block 610a may generate an error value that is computed as shown in the following equation:

$$A_n \cdot A_{n-1}(\sin(\theta_n) \cdot \cos(\theta_{n-1}) - \cos(\theta_n) \cdot \sin(\theta_{n-1})) = A_n \cdot A_{n-1} \cdot \sin(\theta_n - \theta_{n-1}) \qquad \text{Equation [8a]}$$

where the quantity:

$$\Delta\theta = \theta_n - \theta_{n-1} \qquad \text{Equation [8b]}$$

may represent a frequency offset value between the current received symbol and the previous symbol. The frequency offset value may also be referred to as a frequency error value. For small values of $\Delta\theta$, the error value as shown in equation [8a] may be approximated as in the following equation:

$$A_n \cdot A_{n-1} \cdot \sin(\theta_n - \theta_{n-1}) \approx A_n \cdot A_{n-1} \cdot \Delta\theta \qquad \text{Equation [8c]}$$

where the quantity:

$$A_n \cdot A_{n-1} \qquad \text{Equation [8d]}$$

may correspond to a value for a weighting factor that is computed in connection with MRC. The frequency estimator block 610b may be substantially similar to the frequency estimator block 610a.

Based on timing signals received from the AFC control block 622, the frequency estimator blocks 610a and 610b may compute error values as shown in equations [8] for each individual path signal in a received multipath. The timing for reception of each individual path signal may correspond to a distinct "finger" in a rake receiver.

The MRC block 612 may comprise suitable logic, circuitry, and/or code that may enable summing of error values from the frequency estimator blocks 610a and 610b for each finger in the rake receiver. As shown in equation [8c], each error value comprises a frequency offset value $\Delta\theta$ that is multiplied by a weighting factor that corresponds to a value utilized for MRC. Consequently, the output from the MRC block 612 may comprise a weighted sum that is computed based on MRC of frequency offset values.

The AFC gain block 614 may comprise suitable logic, circuitry, and/or code that may enable scaling of the weighted sum computed by the MRC block 612. The scaling of the weighted sum by the AFC gain block 614 may control the rate of AFC adjustment for the demodulation frequency of the crystal oscillator 430 in response to generated MRC block 612 output values.

The XO control loop 616 may comprise suitable, logic, circuitry, and/or code that may enable generation of an XO control voltage based on a scaled weighted sum value generated by the AFC gain block 614. The control voltage may represent an adjustment value that adjusts a current demodulation frequency in the crystal oscillator 430. The adjusted demodulation frequency may be utilized for receiving subsequent signals y(t).

The frequency averaging block 618 may comprise suitable logic, circuitry, and/or code that may enable computation of an average value for weighted sum values computed by the MRC block 612 over a long time interval in comparison to the rate at which individual weighted sum values are computed.

In operation, a MS 140 may receive a signal via a receiving antenna 262. The received signal may be demodulated by a QPSK demodulator 404 based on a demodulation frequency generated by a crystal oscillator 430. The descrambling blocks 552a and 552b may descramble the received signal that was transmitted by a node B element 132 that utilized STTD. The accumulator blocks 554a and 554b and corresponding summing blocks 608a and 608b may enable deriving current symbols. The frequency estimator blocks 610a and 610b may compute an error value based on a computed frequency offset value that may be derived from the corresponding current symbol and a previous symbol. The MRC block 612 may compute a weighted sum based on a plurality of computed error values from the frequency estimator blocks 610a and 610b. The weighted sum may be utilized to generate an adjustment value that may be utilized for adjusting the frequency of the crystal oscillator 430. The adjusted frequency oscillator value may be utilized by the QPSK demodulator 404 to demodulate a subsequent received signal. The processor 254 may select an accumulator window size for the accumulator blocks 554a and/or 554b, and/or select a symbol length (as measured in chips, for example) for the summing blocks, 608a and/or 608b, in response to weighted sum values computed by the MRC block 612.

Various embodiments of the invention may be practiced when the MS 140 comprises a plurality of receiving antennas. In such case, a received signal may be received at each receiving antenna, and the MS 140 may comprise duplicate circuitry for each receiving antenna. The duplicate circuitry may comprise the descrambler blocks 552a and 552b, the accumulator blocks 554a and 554b, the summing blocks 608a and 608b, and frequency estimator blocks 610a and 610b.

Figure 7:
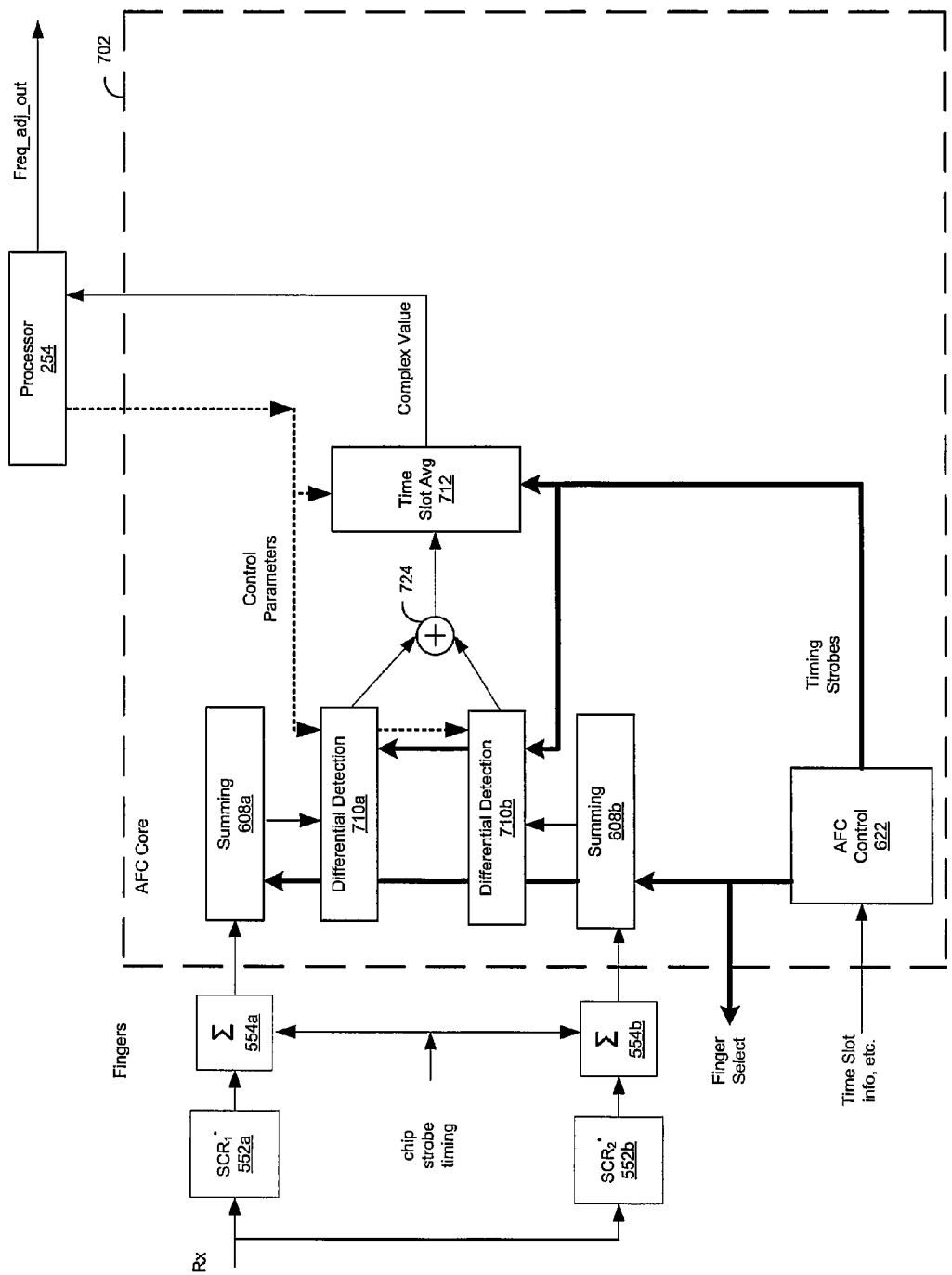
FIG. 7 is a block diagram of exemplary automatic frequency control core circuitry, in accordance with an embodiment of the invention.

FIG. 7 is a block diagram of exemplary automatic frequency control core circuitry, in accordance with an embodiment of the invention. Referring to FIG. 7, there is shown a plurality of descrambler blocks 552a and 552b, a plurality of accumulator blocks 554a and 554b, automatic frequency control (AFC) core circuitry 702, and a processor 254. The AFC core circuitry 702 may comprise a plurality of summing blocks 608a and 608b, a plurality of differential detection blocks 710a and 710b, a summation element 724, a time slot averaging block 712, and an AFC control block 622.

The differential detection block 710a may comprise suitable logic, circuitry, and/or code that may enable computation of a differential value based on a current received symbol, and on at least one previously received symbol. In an exemplary embodiment of the invention, the differential detection block 710a may receive a current symbol, which may be expressed in complex notation as shown in the following equation:

$$r(t) = h(t) \cdot e^{j\phi t} \quad \text{Equation [9]}$$

where h(t) may represent a computed channel estimate associated with the current data symbol and $\phi$ may represent a phase value for the current symbol. The differential detection block 710a may store a previously received symbol, $r^*(t-T_S)$, where $r^*(t-T_S)$ may represent a complex conjugate of the symbol $r(t-T_S)$, and $T_S$ may represent a time duration for a symbol.

The differential detector block 710a may generate a differential value that is computed as shown in the following equation:

$$d(t) = r(t) \cdot r^*(t-T) \quad \text{Equation [10]}$$

when d(t) is represented as real and imaginary components, $d_I(t)$ and $d_Q(t)$ respectively, the individual components may be computed as shown in the following equations:

$$d_I(t) = h_I(t) \cdot h_I(t-T) + h_Q(t) \cdot h_Q(t-T) \quad \text{Equation [11a]}$$

$$d_Q(t) = h_Q(t) \cdot h_I(t-T) - h_Q(t-T) \cdot h_I(t) \quad \text{Equation [11b]}$$

The differential detector block 710b may be substantially similar to the frequency estimator block 710a.

Based on timing signals received from the AFC control block 622, the differential detector blocks 710a and 710b may compute error values as shown in equations [10] and [11] for each individual path signal in a received multipath. The timing for reception of each individual path signal may correspond to a distinct "finger" in a rake receiver.

The summation element 724 may comprise suitable logic, circuitry, and/or code that may enable generating a value equal to a summation of differential values computed by the differential detector blocks 710a and 710b for each finger. The time slot average block 712 may comprise suitable logic, circuitry, and/or code that may enable generating a weighted sum of input values received from the summation element 724. The weighted sum may be computed over a time interval that comprises a plurality of time slots. The weighted sum may represent a weighted average of input values received from the summation element 724, which may be computed based on equal gain combining (EGC), wherein the weighting factor for each input value is about equal. The time slot average block 712 may generate a weighted sum for each finger.

The processor 254 may compute an error value based on equations [11] as shown in the following equation:

$$\text{error} = \frac{d_Q(t)}{\sqrt{d_I^2(t) + d_Q^2(t)}} \quad \text{Equation [12a]}$$

where for small error values, equation [12a] may be approximated as shown in the following equation:

$$\text{error} \cong \frac{d_Q(t)}{d_I(t)} = \frac{\sin(\Delta\theta)}{\cos(\Delta\theta)} \quad \text{Equation [12b]}$$

where $\Delta\theta$ represents the frequency offset value as shown in equation [8b]. Based on the computed error value, an adjustment value may be computed. The adjustment value may be utilized to adjust the current demodulation frequency as described above.

Various embodiments of the invention may be practiced when the MS 140 comprises a plurality of receiving antennas. In such case, a received signal may be received at each receiving antenna, and the MS 140 may comprise duplicate circuitry for each receiving antenna. The duplicate circuitry may comprise the descrambler blocks 552a and 552b, the accumulator blocks 554a and 554b, the summing blocks 608a and 608b, the differential detection blocks 710a and 710b, the summation element 724, and the time slot average block 712.

Figure 8:
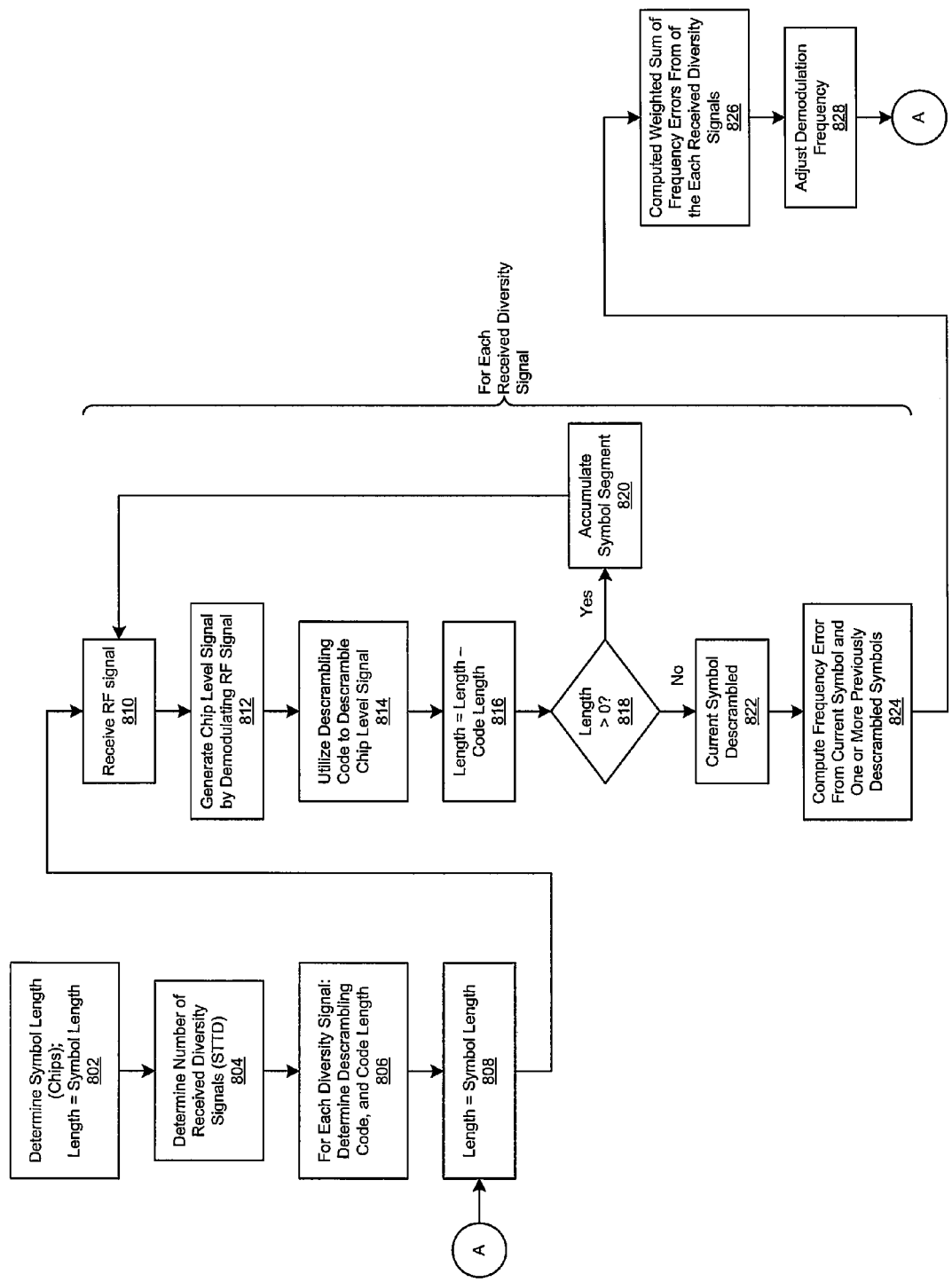
FIG. 8 is a flowchart that illustrates exemplary steps for AFC, in accordance with an embodiment of the invention.

FIG. 8 is a flowchart that illustrates exemplary steps for AFC, in accordance with an embodiment of the invention. Referring to FIG. 8, in step 802, a data symbol length may be selected for the MS 140. The selected data symbol length may be represented by the symbol length parameter. In step 804 the number of diversity signals to be received at the MS 140 may be determined. In various embodiments of the invention, the number of diversity signals received at the MS 140 may be equal to the number of diversity signals transmitted by the node B element 132. In step 806, for an $i^{th}$ received diversity signal, a corresponding descrambling code $SCR_i$ may be determined. A Code Length value for the descrambling code may also be selected.

In step 808, a temporary variable, Length, may be set equal to the symbol length parameter. Steps 810-824 may be performed iteratively for each received diversity signal. In various embodiments of the invention, each iteration may be performed in parallel. In step 810, an RF signal may be received at the MS 140. In step 812, a chip level signal may be generated by demodulating the RF signal. In step 814, the corresponding descrambling code may be utilized to descramble the chip level signal. In step 816, the value of the Length variable may be decremented based on the value of the Code Length variable. Step 818 may determine whether the Length variable is greater than 0. If the Length variable is greater than 0, the descrambled signal may contain a symbol segment, where other segments may be summed to generate a full data symbol. In step 820, the symbol segment may be accumulated. Step 810 may follow.

If the Length variable is not greater than 0 in step 818, in step 822 it may be determined that a full current data symbol has been descrambled. In step 824, a frequency error value may be computed based on the current symbol and at least one previous descrambled symbol. In step 826, a weighted sum may be computed based on a plurality of computed frequency error values computed for each of the received diversity signals. In step 828 the demodulation frequency generated by the crystal oscillator 430 may be adjusted. Step 808 may follow step 828.

Aspects of the system for automatic frequency control (AFC) supporting transmit diversity may comprise AFC core circuitry 602, 702, and/or a processor 254, which enable computation of at least one frequency error value based on one or more previous computed frequency error values, current received symbols, and/or corresponding previously received symbols. A weighted sum may be computed from a plurality of computed frequency error values. The weighted sum may be computed based on maximal ratio combining (MRC), or by equal gain combining (EGC) of the plurality of frequency error values. A current demodulation frequency may be adjusted based on the computed weighted sum. The adjusted demodulation frequency may be utilized for receiving one or more subsequent symbols. The processor 254 may enable computing an adjustment value for the adjustment of the current demodulation frequency based on the computed weighted sum.

A descrambler block 552*a* may enable generation of a current chip level signal as a result of demodulating a current received signal based on the current demodulation frequency. The accumulator block 554*a* may enable generation of at least a portion of each of the current received symbols as a result of descrambling the current chip level signal by utilizing a corresponding descrambling code. The processor 254 may enable selection of a number of chips for each corresponding descrambling code based on the one or more previous computed frequency error values.

The summing block 608*a* may enable generation of the current received symbol by summing each corresponding portion of the received symbol from the accumulator block 554*a*. A current received symbol may comprise a current phase value, and a previously received symbol may comprise a previous phase value. The frequency estimator block 610*a* may enable computation of a frequency error value based on the current phase value and the previous phase value. The differential detection block 710*a* may enable computation of a frequency error value based on a current received symbol and a complex conjugate of a previously received symbol.

Various embodiments of the invention are not limited to wireless communication systems. Various embodiments of the invention may also be practiced in systems, which utilize pilot bits, pilot symbols, and/or pilot frequencies in a manner consistent with the methods and systems set forth above.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for frequency control in a communication system, the method comprising:
performing by one or more circuits and/or processors:
despreading a current chip level signal;
generating at least one subsequent portion of at least one current symbol based on said despreading;
concatenating at least a portion of at least one subsequent intermediate symbol with said generated at least one subsequent portion of said at least one current symbol;
computing at least one frequency error value based on one or more of at least one previous computed frequency error value, said at least one current symbol, and a corresponding at least one previously received symbol;
computing a weighted sum of a plurality of said computed said at least one frequency error value; and
adjusting a current demodulation frequency for receiving at least one subsequent symbol based on said computed weighted sum.

2. The method according to claim 1, comprising generating said current chip level signal based on a current descrambling code.

3. The method according to claim 1, comprising generating at least one subsequent chip level signal that is distinct from said current chip level signal by at least descrambling a corresponding at least one subsequent received signal based on a corresponding at least one subsequent descrambling code.

4. The method according to claim 3, comprising computing at least one subsequent frequency error value based on said generated at least one subsequent chip level signal.

5. The method according to claim 4, comprising computing said weighted sum based on said computed at least one subsequent frequency error value.

6. The method according to claim 3, wherein a current descrambling code is associated with a current transmitting station and said corresponding at least one subsequent descrambling code is associated with a corresponding at least one subsequent transmitting station.

7. The method according to claim 1, comprising computing said at least one frequency error value based on said at least one current received symbol and a complex conjugate of said at least one previously received symbol.

8. The method according to claim 7, comprising computing said at least one frequency error value based on a complex component of a multiplicative product of a value for said current received symbol and a value for said complex conjugate of said at least one previously received symbol divided by a magnitude value of said multiplicative product.

9. The method according to claim 1, wherein said weighted sum is computed based on maximal ratio combining of said plurality of said computed said at least one frequency error value.

10. The method according to claim 1, wherein said weighted sum is computed based on an equal gain combining of said plurality of said computed said at least one frequency error value.

11. The method according to claim 1, comprising computing an adjustment value for said adjusting said current demodulation frequency based on said computed weighted sum.

12. The method according to claim 1, comprising generating said current chip level signal by at least descrambling a current received signal.

13. The method according to claim 12, comprising generating said current chip level signal by at least demodulating said current received signal based on said current demodulation frequency.

14. The method according to claim 12, comprising generating a portion of at least one current received signal by at least despreading said generated current chip level signal.

15. The method according to claim 14, comprising generating a subsequent intermediate symbol by concatenating said generated portion of said at least one current received symbol and a current intermediate symbol.

16. A system for frequency control in a communication system, the system comprising:
one or more circuits that are operable to despread a current chip level signal;
said one or more circuits are operable to generate at least one subsequent portion of at least one current symbol based on said despreading;
said one or more circuits are operable to concatenate at least a portion of at least one subsequent intermediate symbol with said generated at least one subsequent portion of said at least one current symbol;
said one or more circuits are operable to compute at least one frequency error value based on one or more of at least one previous computed frequency error value, said at least one current symbol, and a corresponding at least one previously received symbol;
said one or more circuits are operable to compute a weighted sum of a plurality of said computed said at least one frequency error value; and
said one or more circuits are operable to adjustment a current demodulation frequency for receiving at least one subsequent symbol based on said computed weighted sum.

17. The system according to claim 16, wherein said one or more circuits are operable to generate said current chip level signal based on a current descrambling code.

18. The system according to claim 16, wherein said one or more circuits are operable to generate at least one subsequent chip level signal that is distinct from said current chip level signal by at least descrambling a corresponding at least one subsequent received signal based on a corresponding at least one subsequent descrambling code.

19. The system according to claim 18, wherein said one or more circuits are operable to compute at least one subsequent frequency error value based on said generated at least one subsequent chip level signal.

20. The system according to claim 19, wherein said one or more circuits are operable to compute said weighted sum based on said computed at least one subsequent frequency error value.

21. The system according to claim 18, wherein a current descrambling code is associated with a current transmitting station and said corresponding at least one subsequent descrambling code is associated with a corresponding at least one subsequent transmitting station.

22. The system according to claim 16, wherein said one or more circuits are operable to compute said at least one frequency error value based on said at least one current received symbol and a complex conjugate of said at least one previously received symbol.

23. The system according to claim 22, wherein said one or more circuits are operable to compute said at least one frequency error value based on a complex component of a multiplicative product of a value for said current received symbol and a value for said complex conjugate of said at least one previously received symbol divided by a magnitude value of said multiplicative product.

24. The system according to claim 16, wherein said weighted sum is computed based on maximal ratio combining of said plurality of said computed said at least one frequency error value.

25. The system according to claim 16, wherein said weighted sum is computed based on an equal gain combining of said plurality of said computed said at least one frequency error value.

26. The system according to claim 16, wherein said one or more circuits are operable to compute an adjustment value for said adjustment of said current demodulation frequency based on said computed weighted sum.

27. The system according to claim 16, wherein said one or more circuits are operable to generate said current chip level signal by at least descrambling a current received signal.

28. The system according to claim 27, wherein said one or more circuits are operable to generate said current chip level signal of by at least demodulating said current received signal based on said current demodulation frequency.

29. The system according to claim 27, wherein said one or more circuits are operable to generate a portion of at least one current received signal by at least despreading said generated current chip level signal.

30. The method according to claim 29, wherein said one or more circuits are operable to generate a subsequent intermediate symbol by concatenating said generated portion of said at least one current received symbol and a current intermediate symbol.

31. A computer readable medium having stored thereon, a computer program having at least one code section for frequency control in a communication system, the at least one code section being executable by a computer for causing the computer to perform steps comprising:
despreading a generated current chip level signal to generate at least one subsequent portion of at least one current received symbol, wherein said at least one current received symbol is generated by concatenating at least said portion of at least one subsequent intermediate symbol and said at least one subsequent portion of said at least one current received symbol;
computing at least one frequency error value based on one or more of at least one previous computed frequency error value, said at least one current received symbol, and a corresponding at least one previously received symbol;
computing a weighted sum of a plurality of said computed said at least one frequency error value; and
adjusting a current demodulation frequency for receiving at least one subsequent symbol based on said computed weighted sum.

32. The computer readable medium according to claim 31, wherein said at least one code section comprises code for generating said current chip level signal based on a current descrambling code.

33. The computer readable medium according to claim 31, wherein said at least one code section comprises code for generating at least one subsequent chip level signal that is distinct from said current chip level signal by at least descrambling a corresponding at least one subsequent received signal based on a corresponding at least one subsequent descrambling code.

34. The computer readable medium according to claim 33, wherein said at least one code section comprises code for computing at least one subsequent frequency error value based on said generated at least one subsequent chip level signal.

35. The computer readable medium according to claim 34, wherein said at least one code section comprises code for computing said weighted sum based on said computed at least one subsequent frequency error value.

36. The computer readable medium according to claim 33, wherein a current descrambling code is associated with a current transmitting station and said corresponding at least one subsequent descrambling code is associated with a corresponding at least one subsequent transmitting station.

37. The computer readable medium according to claim 31, wherein said weighted sum is computed based on an equal gain combining of said plurality of said computed said at least one frequency error value.

38. The computer readable medium according to claim 31, wherein said at least one code section comprises code for generating said current chip level signal by at least demodulating said current received signal based on said current demodulation frequency.

39. The computer readable medium according to claim 31, wherein said at least one code section comprises code for generating said current chip level signal by at least descrambling a current received signal.

40. The computer readable medium according to claim 39, wherein said at least one code section comprises code for generating a portion of at least one current received signal by at least despreading said generated current chip level signal.

41. The computer readable medium according to claim 40, wherein said at least one code section comprises code for generating a subsequent intermediate symbol by concatenating said generated portion of said at least one current received symbol and a current intermediate symbol.

* * * * *